(12) United States Patent
Heringa et al.

(10) Patent No.: US 8,729,652 B2
(45) Date of Patent: May 20, 2014

(54) SEMICONDUCTOR DEVICE FOR RADIATION DETECTION

(75) Inventors: Anco Heringa, Eindhoven (NL); Erik Jan Lous, Nijmegen (NL); Wibo Daniel Van Noort, Wappingers Falls, NY (US); Wilhelmus Cornelis Maria Peters, Nijmegen (NL); Joost Willem Christiaan Veltkamp, Nijmegen (NL)

(73) Assignee: Trixell, Moirans (FR)

( * ) Notice: Subject to any disclaimer, the term of this patent is extended or adjusted under 35 U.S.C. 154(b) by 573 days.

(21) Appl. No.: 12/282,932

(22) PCT Filed: Mar. 13, 2007

(86) PCT No.: PCT/IB2007/050834
§ 371 (c)(1),
(2), (4) Date: Sep. 15, 2008

(87) PCT Pub. No.: WO2007/105166
PCT Pub. Date: Sep. 20, 2007

(65) Prior Publication Data
US 2009/0096046 A1 Apr. 16, 2009

(30) Foreign Application Priority Data
Mar. 15, 2006 (EP) ...................... 06111166

(51) Int. Cl.
*H01L 31/115* (2006.01)
(52) U.S. Cl.
USPC .................................. 257/429; 257/E31.086
(58) Field of Classification Search
USPC .................. 257/428, 429, E31.086, E31.092
See application file for complete search history.

(56) References Cited

U.S. PATENT DOCUMENTS

| 4,220,483 A | * | 9/1980 | Cazcarra ...................... 438/471 |
| 4,506,436 A | | 3/1985 | Bakeman, Jr. et al. |
| 5,187,380 A | | 2/1993 | Michon et al. |
| 5,576,561 A | | 11/1996 | Colella et al. |
| 5,854,506 A | * | 12/1998 | Fallica .......................... 257/429 |
| 6,207,977 B1 | * | 3/2001 | Augusto ....................... 257/192 |
| 6,541,835 B1 | * | 4/2003 | Pettersson et al. ............ 257/429 |
| 6,597,025 B2 | * | 7/2003 | Lauter et al. .......... 257/E31.086 |
| 6,690,074 B1 | | 2/2004 | Dierickx et al. |
| 2002/0056810 A1 | | 5/2002 | Kobayashi et al. |

FOREIGN PATENT DOCUMENTS

WO   0118564 A1   3/2001

* cited by examiner

*Primary Examiner* — Stephen W Smoot
*Assistant Examiner* — Sun M Kim
(74) *Attorney, Agent, or Firm* — Baker & Hostetler LLP

(57) ABSTRACT

The invention provides a semiconductor device (11) for radiation detection, which comprises a substrate region (1) of a substrate semiconductor material, such as silicon, and a detection region (3) at a surface of the semiconductor device (11), in which detection region (3) charge carriers of a first conductivity type, such as electrons, are generated and detected upon incidence of electromagnetic radiation (L) on the semiconductor device (11). The semiconductor device (11) further comprises a barrier region (2,5,14) of a barrier semiconductor material or an isolation material, which barrier region (2,5,14) is an obstacle between the substrate region (1) and the detection region (3) for charge carriers that are generated in the substrate region (1) by penetration of ionizing radiation (X), such as X-rays, into the substrate region (1). This way the invention provides a semiconductor device (11) for radiation detection in which the influence on the performance of the semiconductor device (11) of ionizing radiation (X), such as X-rays, that penetrates into the substrate region (1) is reduced.

9 Claims, 3 Drawing Sheets

SEMICONDUCTOR DEVICE FOR RADIATION DETECTION

Figure 1:
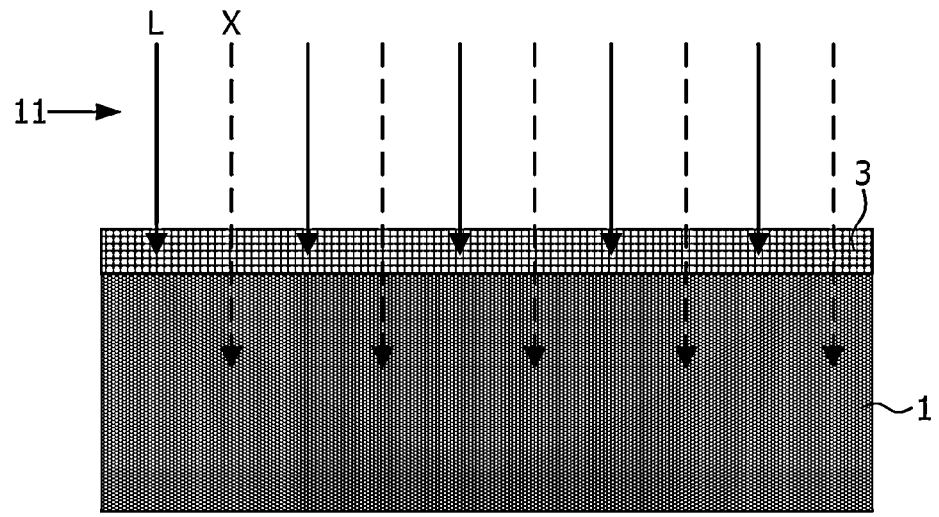

The invention relates to a semiconductor device for radiation detection.

Semiconductor based devices, or sensors, for detecting electromagnetic radiation are known in the art. These sensors are implemented in a substrate in an IC (Integrated Circuit) technology such as an MOS (Metal Oxide Semiconductor), CMOS (Complementary Metal Oxide Semiconductor) or CCD (Charged Coupled Device) technology, utilizing so-called collection junctions, which are regions adapted for collecting charge carriers generated in the substrate by the electromagnetic radiation and which are either pn- or np-junctions.

For detecting ionizing radiation, such as X-rays, a scintillation material may be applied in which electromagnetic radiation is generated by the ionizing (X-ray) radiation hitting the scintillation material, which electromagnetic radiation is subsequently detected by photo detectors. Replacing the photo detectors by the semiconductor based sensors that are implemented in a low cost CMOS or MOS technology, offers several advantages, such as cost reduction and integrated functionality. However, the ionizing radiation will also pass through the scintillation material and penetrate deeper into the substrate than the electromagnetic radiation generated by the ionizing radiation striking on the scintillation material. Consequently, the ionizing radiation also generates, unwanted or parasitic, charge carriers in the substrate, which degrade the detection functionality of the electromagnetic radiation and hence the performance of the semiconductor based sensors significantly.

U.S. Pat. No. 6,690,074 discloses a semiconductor device structure for reducing radiation induced current flow caused by incident ionizing radiation. The structure comprises a substrate, two or more regions of a second conductivity type in the substrate, and a guard ring of a first conductivity type for obstructing radiation induced parasitic current flow between the two or more regions of the second conductivity type. The structure may be used in a pixel, e.g. in a diode or a transistor, which is sensitive to electromagnetic radiation, for increasing radiation resistance. The disadvantage of this device is that it only obstructs radiation induced parasitic current flow between the two or more regions of the second conductivity type and that it does not obstruct a further parasitic current flow between the substrate and the device, which further current flow is induced by radiation penetrating below the device into the substrate and disadvantageously degrades the performance of this device.

It is an object of the invention to provide a semiconductor device for radiation detection in which the influence on the performance of the semiconductor device of ionizing radiation that penetrates into the substrate is reduced. The invention provides a device as claimed in claim 1. Advantageous embodiments are defined by the dependent claims.

The semiconductor device for radiation detection according to the invention comprises a substrate region of a substrate semiconductor material and a detection region at a surface of the semiconductor device, in which detection region charge carriers of a first conductivity type are generated and detected upon incidence of electromagnetic radiation on the semiconductor device. The semiconductor device further comprises a barrier region, which is an obstacle between the substrate region and the detection region for charge carriers that are generated in the substrate region by penetration of ionizing radiation into the substrate region. By placing an obstruction for parasitic current flow, induced by ionizing radiation in the substrate, between the substrate and the semiconductor device, the number of parasitic charge carriers that are generated by the ionizing radiation in the substrate region and that reach the detection region, is reduced significantly. Hence, the negative influence of these parasitic charge carriers on the semiconductor device is significantly reduced, enabling an improved accuracy of the detection of the electromagnetic radiation.

In an embodiment of the device according to the invention the barrier region comprises a barrier semiconductor material. The semiconductor based barrier region enables a confinement of the parasitic charge carriers that are generated by the ionizing radiation in the substrate region. In a favorable embodiment the barrier region and the substrate region are of a second conductivity type, opposite to the first conductivity type, wherein the barrier region has a higher doping level than the substrate region. This way the parasitic charge carriers that are generated by the ionizing radiation in the substrate region and that are of a conductivity type opposite to the second conductivity type, are advantageously confined by the relatively high doped barrier region.

In a favorable embodiment the barrier region, comprising the barrier semiconductor material, further comprises a further barrier semiconductor material that lowers the band gap of the barrier region, which facilitates recombination of the parasitic charge carriers in the barrier region. Preferably, the barrier semiconductor material comprises silicon and the further barrier semiconductor material comprises a mixture of silicon and germanium.

In another favorable embodiment the semiconductor device further comprises a draining region of draining semiconductor material of the first conductivity type, which extends into the substrate region and adjoins a side region of the detection region and a side region of the barrier region. The draining region, being of the first conductivity type, advantageously sinks parasitic charge carriers of the first conductivity type generated by the ionizing radiation in the substrate region. Preferably, the side region of the detection region that adjoins the draining region is of a second conductivity type, opposite to the first conductivity type, thereby advantageously bounding the detection region laterally and reducing the chance that charge carriers generated in the detection region reach the draining region.

In another embodiment of the device according to the invention the substrate region and the barrier region, comprising the barrier semiconductor material, are of a second conductivity type, opposite to the first conductivity type, and the barrier region is in between the detection region and a further barrier region comprising a second barrier semiconductor material of the first conductivity type, which is in between the barrier region and the substrate region. The further barrier region, being of the first conductivity type, sinks the parasitic charge carriers of the first conductivity type that are generated by the ionizing radiation in the substrate region. Preferably, the substrate region has a doping level higher than $10^{16}$ atoms per $cm^3$. The relatively high doping level of the substrate region, being of the second conductivity type, reduces the lifetime of the parasitic charge carriers of the first conductivity type in the substrate region with respect to a lower doping level of the substrate region.

In another embodiment of the device according to the invention the barrier region comprises an isolation material, thereby effectively blocking the parasitic charge carriers generated in the substrate region from entering the detection region. In a favorable embodiment the detection region comprises an interface region of a second conductivity type, opposite to the first conductivity type, which adjoins the barrier region, which comprises the isolation material. The interface region reduces the chance that charge carriers generated in the detection region recombine at the surface of the isolation region. Preferably, the substrate region has a doping level higher than $10^{16}$ atoms per $cm^3$. The relatively high doping level of the substrate region, being of the second conductivity type, reduces the lifetime of the parasitic charge carriers of the first conductivity type in the substrate region with respect to a lower doping level of the substrate region.

In another embodiment of the device according to the invention the substrate region comprises a recombination region, which reduces the lifetime of the charge carriers in the substrate region. This reduces the number of parasitic charge carriers that reach the barrier region. In a preferred embodiment the recombination region is formed by diffusion and precipitation of oxygen atoms.

These and other aspects of the invention will be further elucidated and described with reference to the drawings, in which:

FIG. 1 is a diagrammatic cross-sectional view of an embodiment of a device according to the prior art; and FIGS. 2-6 are diagrammatic cross-sectional views of embodiments of a device according to the invention.

The Figures are not drawn to scale. In general, identical components are denoted by the same reference numerals in the figures.

Scintillation material emits low-energy photons or electromagnetic radiation, usually in the visible range, when struck by a high-energy charged particle, such as X-rays X. In a semiconductor device 11 for detecting ionizing radiation, such as for example X-rays X, the X-rays X pass through the scintillation material thereby generating electromagnetic radiation, which is subsequently detected by a semiconductor device 11 according to the invention. However, also the X-rays X that pass through the scintillation material will penetrate the semiconductor device 11. FIG. 1 illustrates that electromagnetic radiation L, indicated by arrows L, and originating from the scintillation material (not shown), which is struck by X-rays X, hits on and penetrates the semiconductor device 11. Furthermore, also the X-rays, indicated by dashed arrows X, passing through the scintillation material (not shown), enter the semiconductor device 11. The semiconductor device 11 comprises a detection region 3, which is able to detect the electromagnetic radiation L by detecting, in this case, electrons that are generated by the electromagnetic radiation L, using devices and techniques that are known in the art. Furthermore, the semiconductor device 11 comprises a substrate region 1, here of a p-type material, into which the X-rays X will penetrate, whereas the electromagnetic radiation L, having a relatively lower energy than the X-rays X, will only penetrate into the detection region 3. The X-rays X generate electrons and holes in the substrate region 1, and part of the, in this case, X-ray generated electrons penetrate into the detection region 3 thereby disturbing the detection of the electrons that are generated by the electromagnetic radiation L which disadvantageously affects the performance of the semiconductor device 11 for detecting electromagnetic radiation.

Figure 2:
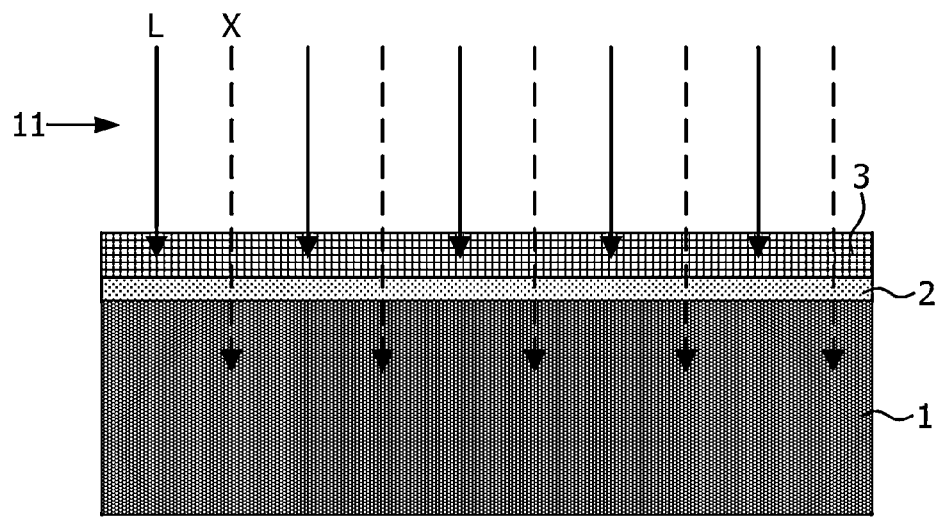

In order to reduce the influence of the X-ray generated electrons on the performance of the semiconductor device 11, a p-type barrier region 2, comprising a semiconductor material such as silicon, is formed in the semiconductor device 11 in between the detection region 3 and the substrate region 1, as is shown in FIG. 2. The doping level of the p-type barrier region 2 is higher than the doping level of the substrate region 1, which confines the X-ray generated electrons to the substrate region 1 and makes it less likely the X-ray generated electrons cross the higher doped p-type barrier region 2 from the substrate region 1 into the detection region 3.

The number of X-ray generated electrons reaching the detector region 3 is reduced by incorporating oxygen atoms in the substrate region 1, thereby creating crystal defects in the substrate region 1 which facilitates the recombination of the X-ray generated electrons in the substrate region. For example, the oxygen atoms are diffused and precipitated by a three-step furnace step, in which the first step comprises the diffusion of the oxygen from the surface into the substrate region 1 at a temperature of 1100° C. to 1150° C. during 2 to 6 hours in a nitrogen ambient, followed by the second step comprising a precipitation of the oxygen at 600° C. to 700° C. during 2 to 6 hours, and finally via a slow increase of the temperature, in the order of 1° C. per minute, the third step comprising the creation of crystal defects by precipitation of oxygen clusters at a temperature of 1000° C. to 1100° C. during 0.5 to 2.0 hours in a nitrogen ambient. The concentration of oxygen atoms is in the order of $10^{17}$ to $10^{18}$ oxygen atoms per $cm^3$.

In an alternative embodiment the p-type barrier region 2 comprises a mixture of silicon and germanium, preferably with a germanium doping level such that the potential barrier for the X-ray generated electrons is lower at the side of the substrate region 1 than the potential barrier at the side of the detection region 3. This makes it difficult for the X-ray generated electrons to enter the detection region 3. The germanium in the p-type barrier region 2 reduces the band gap of this region with respect to the value of 1.11 eV of silicon, which facilitates the recombination of the X-ray generated electrons with holes in the p-type barrier region 2, thereby reducing the number of X-ray generated electrons. Preferably the germanium content is high and in the range between 20% to 30%.

Figure 3:
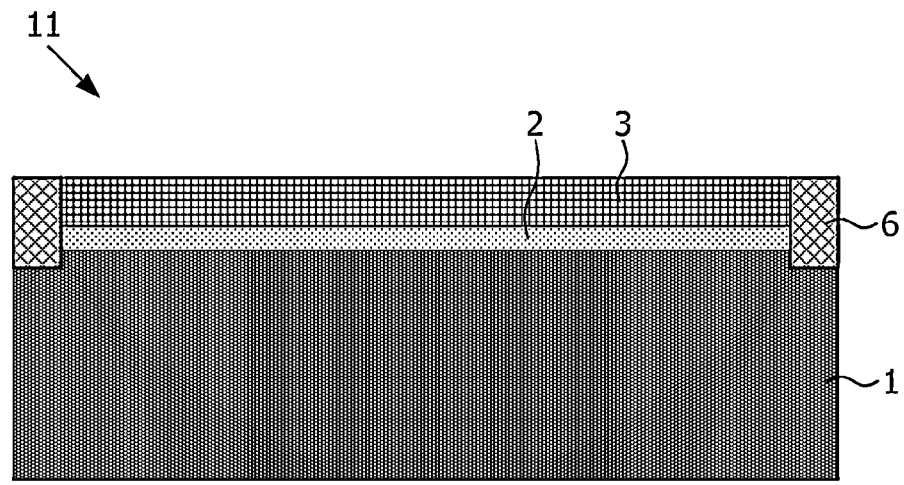
Figure 4:
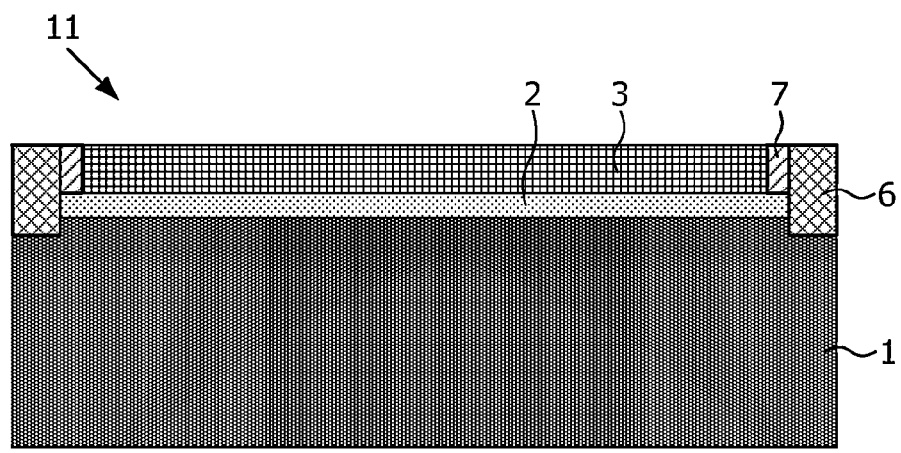

FIG. 3 shows a further improvement of the embodiment depicted in FIG. 2. An n-type plug region 6 penetrates into the substrate region 1 and borders the sides of the detection region 3 and the p-type barrier region 2. The n-type plug region 6 sinks or drains the X-ray generated electrons that reach the n-type plug region 6 via diffusion. Preferably the n-type plug regions 6 are bordering each photo diode (not shown) in the detection region 3. By forming a p-type plug region 7 in between the n-type plug region 6 and the detection region 3, as is shown in FIG. 4, any draining in the n-type plug region 6 of electrons generated in the detection region 3 is reduced. It should be noted that the n-type plug region 6 may also be replaced by an electrically isolating region, such as a shallow trench isolation region filled with, for example, silicon dioxide. In this case the p-type plug region 7 reduces the chance that electrons generated in the detection region 3 reach the recombination sites at the interface between the electrically isolating region and the p-type plug region 7.

Figure 5:
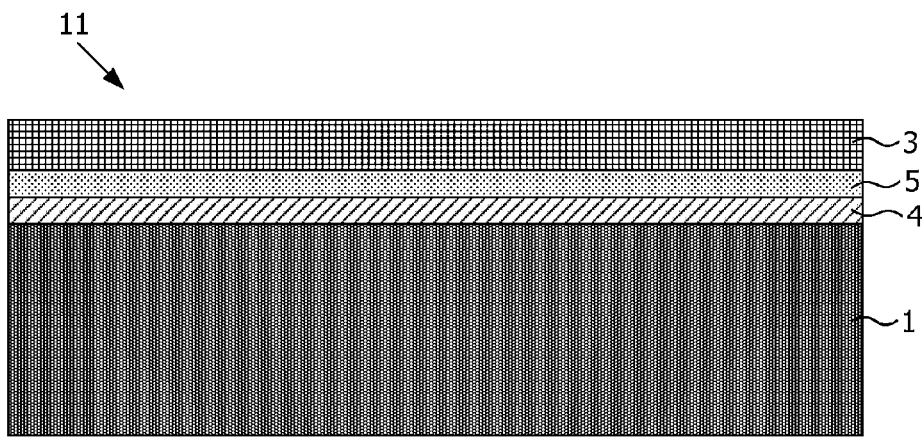

Another way to reduce the number of X-ray generated electrons that reach the detection region 3 is depicted in FIG. 5. The semiconductor device 11 in this case comprises a p-type barrier region 5 below the detection region 3 and a buried n-type barrier region 4 in between the p-type barrier region 5 and the substrate region 1. Optionally the substrate region 1 has a relatively high doping level, for example $10^{16}$ atoms per $cm^3$ or higher. The relatively high doping level of the substrate region 1 reduces the lifetime of the X-ray generated electrons in the substrate region 1 and the buried n-type region 4 sinks or drains the X-ray generated electrons from the substrate region 1 that try to enter the detection region 3. The p-type region 5 has a doping level in the order of $10^{15}$ atoms per $cm^3$ or higher.

Figure 6:
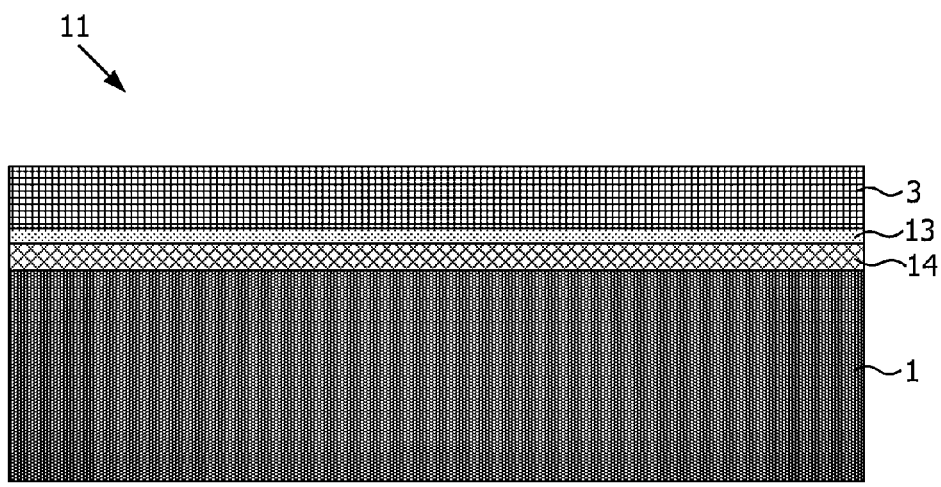

FIG. 6 shows an alternative embodiment in which the semiconductor device 11 comprises a p-type interface region 13 in between the detection region 3 and an isolation barrier region 14, for example silicon dioxide, which is in between the p-type interface region 13 and the substrate region 1. The isolation region 14 blocks the electrons generated by the X-rays in the substrate region 1 from entering the detection region 3. The p-type interface region 13 has a higher doping level than adjoining p-type regions of the detection region 3 thereby reducing the chance that electrons generated in the detection region 3 reach the recombination sites at the interface between the isolation barrier region 14 and the p-type barrier region 5.

It should be noted that the n-type plug region 6 and optionally the p-type plug region 7 (see FIGS. 3 and 4) may optionally be added to the embodiments of FIG. 5 and FIG. 6.

In summary, the invention provides a semiconductor device for radiation detection, which comprises a substrate region of a substrate semiconductor material, such as silicon, and a detection region at a surface of the semiconductor device, in which detection region charge carriers of a first conductivity type, such as electrons, are generated and detected upon incidence of electromagnetic radiation on the semiconductor device. The semiconductor device further comprises a barrier region, of a barrier semiconductor material or an isolation material, which barrier region is an obstacle between the substrate region and the detection region for charge carriers that are generated in the substrate region by penetration of ionizing radiation, such as X-rays, into the substrate region. This way the invention provides a semiconductor device for radiation detection in which the influence on the performance of the semiconductor device of ionizing radiation, such as X-rays, that penetrates into the substrate region is reduced.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. A semiconductor device for radiation detection comprising:
   a substrate region of a substrate semiconductor material; and
   a detection region at a surface of the semiconductor device, wherein charge carriers of a first conductivity type are generated and detected upon incidence of electromagnetic radiation (L) on the detection region at the surface of the semiconductor device, the semiconductor device further comprising:
   a barrier region, wherein the barrier region (i) comprises an obstacle between the substrate region and the detection region for confining parasitic charge carriers to the substrate region, wherein the parasitic charge carriers are generated in the substrate region by penetration of ionizing radiation (X) through the detection region at the surface of the semiconductor device and into the substrate region, and (ii) reduces an influence of the ionizing radiation (X) on a performance of the detection region for detecting charge carriers of the first conductivity type in the detection region, and wherein the substrate region includes a recombination region that comprises a concentration of oxygen atoms on the order of $10^{18}$ oxygen atoms per $cm^3$ for reducing a lifetime of the parasitic charge carriers that are generated in the substrate region,
   wherein the barrier region comprises a barrier semiconductor material, and
   wherein the barrier region further comprises a further barrier semiconductor material, wherein the further barrier semiconductor material of the barrier region lowers a band gap of the barrier region to facilitate recombination in the barrier region of the parasitic charge carriers generated in the substrate region.

2. The device as claimed in claim 1, wherein the barrier region and the substrate region are of a second conductivity type, opposite to the first conductivity type, and wherein the barrier region has a higher doping level than the substrate region.

3. The device as claimed in claim 1, wherein (i) the barrier semiconductor material of the barrier region comprises silicon and (ii) the further barrier semiconductor material of the barrier region comprises a mixture of silicon and germanium with a germanium doping level such that a potential barrier for parasitic charge carriers generated in the substrate region is lower at a side of the barrier region proximate the substrate region than a potential barrier at a side of the barrier region proximate the detection region.

4. The device as claimed in claim 1, further comprising:
   a draining region of draining semiconductor material of the first conductivity type, wherein the draining region (i) extends into the substrate region and (ii) adjoins a side region of the detection region and a side region of the barrier region.

5. The device as claimed in claim 4, wherein the side region of the detection region that adjoins the draining region is of a second conductivity type, opposite to the first conductivity type.

6. The device as claimed in claim 1, wherein the substrate region and the barrier region are of a second conductivity type, opposite to the first conductivity type, and wherein the barrier region is in between (i) the detection region and (ii) a further barrier region, wherein the further barrier region comprises a second barrier semiconductor material of the first conductivity type, wherein the second barrier semiconductor material is in between the barrier region and the substrate region.

7. The device as claimed in claim 6, wherein the draining region also adjoins a side region of the further barrier region.

8. The device as claimed in claim 1, wherein the barrier region comprises an isolation material.

9. The device as claimed in claim 8, wherein the detection region comprises an interface region of a second conductivity type, opposite to the first conductivity type, which adjoins the barrier region.

* * * * *